United States Patent
Nie et al.

(10) Patent No.: US 11,348,645 B1
(45) Date of Patent: May 31, 2022

(54) METHOD FOR PROGRAMMING B4 FLASH MEMORY

(71) Applicant: CHINA FLASH CO., LTD., Shanghai (CN)

(72) Inventors: Hong Nie, Shanghai (CN); Jingwei Chen, Shanghai (CN)

(73) Assignee: CHINA FLASH CO., LTD., Shanghai (CN)

( * ) Notice: Subject to any disclaimer, the term of this patent is extended or adjusted under 35 U.S.C. 154(b) by 0 days.

(21) Appl. No.: 17/465,272

(22) Filed: Sep. 2, 2021

(30) Foreign Application Priority Data

Nov. 13, 2020 (CN) .......................... 202011269500.7

(51) Int. Cl.
  *G11C 11/34* (2006.01)
  *G11C 16/10* (2006.01)
  *G11C 16/04* (2006.01)
  *G11C 16/30* (2006.01)
  *G11C 16/26* (2006.01)

(52) U.S. Cl.
  CPC ........ *G11C 16/102* (2013.01); *G11C 16/0433* (2013.01); *G11C 16/26* (2013.01); *G11C 16/30* (2013.01)

(58) Field of Classification Search
  CPC ......... G11C 16/10; G11C 16/30; G11C 16/12; G11C 16/0483; H01L 27/115
  USPC ....................................... 365/185.18, 189.16
  See application file for complete search history.

(56) References Cited

U.S. PATENT DOCUMENTS

| | | | | |
|---|---|---|---|---|
| 6,078,519 A | * | 6/2000 | Kanamitsu | G11C 16/10 365/185.03 |
| 7,623,384 B2 | * | 11/2009 | Iwata | G11C 8/10 365/185.03 |
| 2010/0283099 A1 | | 11/2010 | Ajika et al. | |
| 2011/0176365 A1 | | 7/2011 | Liu | |

FOREIGN PATENT DOCUMENTS

| | | |
|---|---|---|
| CN | 1917213 A | 2/2007 |
| CN | 101430931 A | 5/2009 |
| CN | 105226065 A | 1/2016 |
| CN | 105470258 A | 4/2016 |

\* cited by examiner

*Primary Examiner* — Son T Dinh
(74) *Attorney, Agent, or Firm* — Global IP Services; Tianhua Gu

(57) ABSTRACT

A method for programming a B4 flash memory includes: floating a source of a P-channel flash memory device; separately applying voltages to a gate, a drain, and a bulk of the P-channel flash memory device, and injecting holes into the bulk, so that electrons are gathered in the drain to form primary electrons; separately applying voltages to the drain and the bulk, so that an electric field is formed between the drain and the bulk, where the holes accelerate downward under the action of the electric field and impact the bulk in the P-channel flash memory device to generate secondary electrons; and separately applying voltages to the gate and the bulk of the P-channel flash memory device, so that the secondary electrons form tertiary electrons under the action of the electric field in a vertical direction, where the tertiary electrons are superposed with the primary electrons to be injected into a floating gate.

9 Claims, 5 Drawing Sheets

METHOD FOR PROGRAMMING B4 FLASH MEMORY

CROSS REFERENCE TO RELATED APPLICATION

The present application claims the benefit of priority to Chinese Patent Application No. CN 2020112695007, entitled "METHOD FOR PROGRAMMING B4 FLASH MEMORY", filed with CNIPA on Nov. 13, 2020, the disclosure of which is incorporated herein by reference in its entirety for all purposes.

TECHNICAL FIELD

The present disclosure relates to the field of memories, and in particular, to a method for programming a B4 flash memory.

BACKGROUND

Flash memories are widely used in various storage media (such as smart cards, memory cards, and the like), and are very important semiconductor devices. Flash memories are classified into a NAND flash memory and a NOR flash memory according to a circuit array manner. The NOR flash memory is increasingly and widely applied in Bluetooth headsets, microcontrollers, and the like by virtue of its fast access speed. Nowadays, most commercial NOR flashes adopt a classic EEPROM with tunnel oxide (ETOX) structure and are based on hot carrier injection (HCI).

In order to generate hot electrons, a high voltage is required to be applied to a gate and a drain of the flash memory cell. Due to physical characteristics of hot carrier injection, power consumption may be large, and carrier injection efficiency may be low, these shortcomings are contrary to the low power consumption requirements of the current market. Moreover, in order to improve the carrier injection efficiency, Silicon Storage Technology Inc. (SST) proposed a source-side channel hot electron (SSCHE) injection method using a split-gate structure and a 2T flash memory cell programmed by means of Fowler-Nordheim (FN) tunneling. However, all of above processing technologies use an N-channel flash memory device.

A P-channel flash memory was first proposed by Hsu, et al. The P-channel flash memory is different from the traditional N-channel flash memory. The traditional N-channel flash memory works in a current saturation interval. However, the P-channel flash memory works in a reverse bias area, significantly reducing power consumption. The P-channel flash memory device is programmed by means of band-to-band tunneling, which has higher programming injection efficiency and a larger programming speed compared with the traditional N-channel flash memory.

Since a high voltage is required to be applied to form electron tunneling during programming of the P-channel flash memory device, a body punch-through effect occurs in a horizontal direction. In order to overcome the disadvantage, in 2006, Shukuri et al. invented a new method for programming a P-channel flash memory: back-bias-assisted band-to-band tunneling-induced hot-electron injection (B4-Flash for short).

In a schematic voltage diagram of a current commercial B4 flash programming operation, voltages are simultaneously applied to a gate, a drain, a source, and a bulk to form electron tunneling. A voltage difference between the gate and the bulk helps electrons obtain kinetic energy to overcome a barrier of a tunnel oxide layer. The electrons are injected into the floating gate through the drain to complete the programming.

B4 Flashes are proven to be commercially available for 65 nm and above fabrication processes in a large scale. However, as a channel length of a flash memory is miniatured, a body punch-through effect cannot be avoided for conventional programming method. A new programming method is required to ensure that B4 flashes can still work in 65 nm and below fabrication processes.

Therefore, a programming method to ensure that a gate length of the P-channel flash memory device can be further reduced is urgently needed by those skilled in the art.

SUMMARY OF THE PRESENT DISCLOSURE

In view of the foregoing disadvantages of the prior art, the present disclosure aims to provide a method for programming a B4 flash memory to resolve a problem that a gate length of a P-channel flash memory device cannot be further reduced in the prior art.

In order to achieve the above objective and other related objectives, the present disclosure provides a method for programming a B4 flash memory. The method for programming a B4 flash memory comprises:

S1): providing a P-channel flash memory device, and floating a source of the P-channel flash memory device;

S2): separately applying voltages to a gate, a drain, and a bulk of the P-channel flash memory device to generate electron hole pairs, and injecting holes into the bulk, so that electrons are gathered at the drain to form primary electrons;

S3): separately applying voltages to the drain and the bulk of the P-channel flash memory device, so that an electric field is formed between the drain and the bulk, where within a preset time period, the holes accelerate downward under the action of the electric field and impact the bulk in the P-channel flash memory device to generate secondary electrons; and S4): separately applying voltages to the gate and the bulk of the P-channel flash memory device, so that the secondary electrons form tertiary electrons under the action of the electric field in a vertical direction, wherein the tertiary electrons are superposed with the primary electrons formed in operation S2) to be injected into a floating gate of the P-channel flash memory device, to complete the programming.

Optionally, in operation 2), the voltages applied to the gate and the bulk are the same.

More optionally, a difference between the voltages applied to the gate and the bulk and the voltage applied to the drain is not less than 10 V.

Optionally, in operation 3), the voltage applied to the bulk is less than the voltage applied to the drain.

More optionally, in operation 3), a difference between the voltage applied to the bulk and the voltage applied to the drain is not less than 4 V.

Optionally, the preset time period is set to 10 ns to 100 ns.

Optionally, in operation S4), the voltage applied to the bulk of the P-channel flash memory device is less than the voltage applied to the gate.

More optionally, before operation S1), the method further comprises pre-erasing the P-channel flash memory device to remove a residual charge in the floating gate.

More optionally, voltages are separately applied to the gate and the bulk of the P-channel flash memory device, and the voltage applied to the bulk is greater than the voltage applied to the gate.

More optionally, a difference between the voltages applied to the gate and the bulk is not less than 10 V.

As described above, the method for programming a B4 flash memory in accordance to the present disclosure has the following beneficial effects:

In the method for programming a B4 flash memory in accordance to the present disclosure, by means of an improved and optimized programming voltage operation mode, a combination of tertiary electron excitation and band-to-band tunneling is formed for programming, which can effectively improve programming efficiency. In addition, a body punch-through effect can be avoided, creating a condition for further miniaturization of a flash memory.

DESCRIPTION OF REFERENCE NUMERALS OF ELEMENTS

Figure 1:
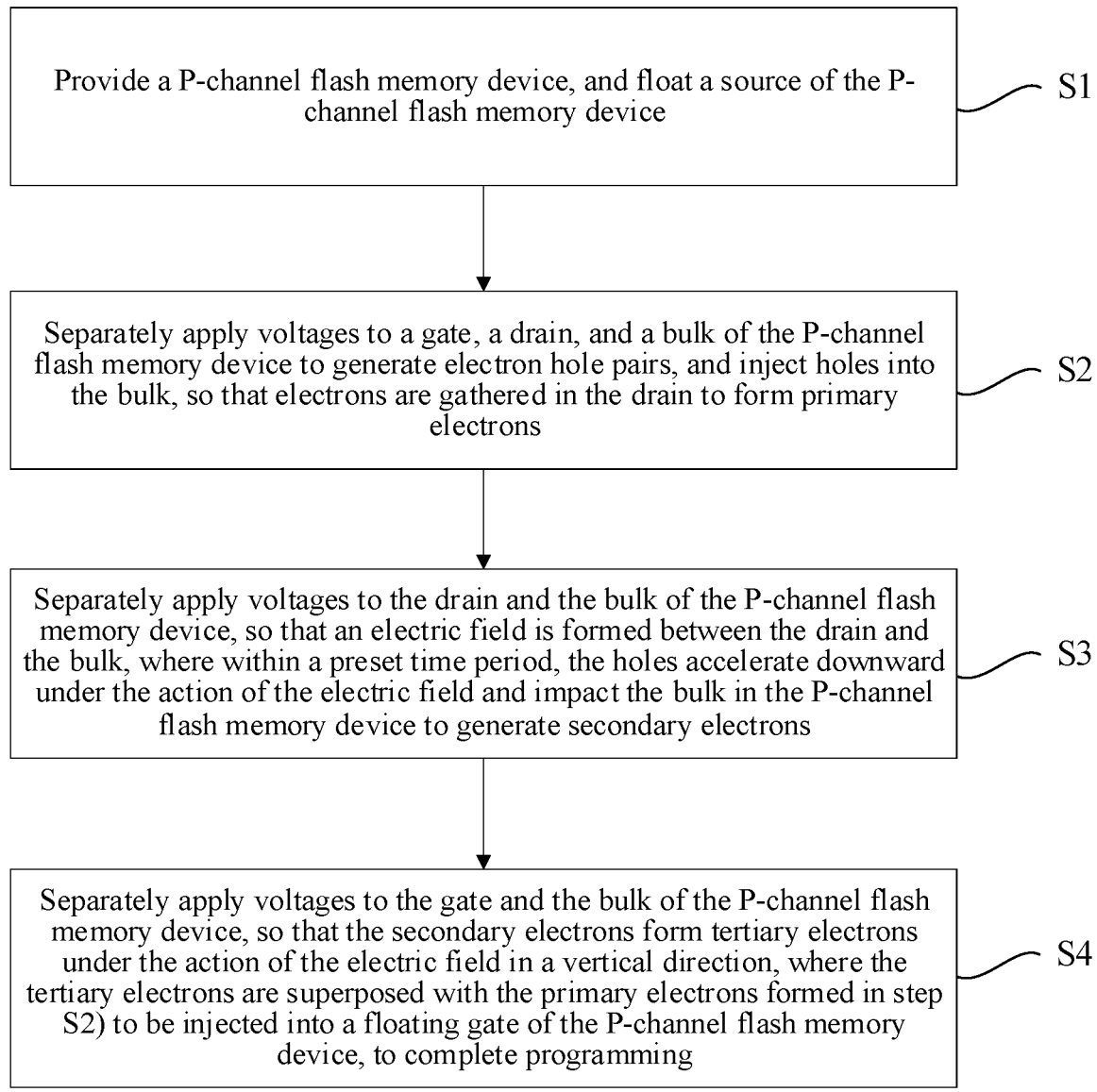
FIG. 1 is a schematic flowchart of a method for programming a B4 flash memory in accordance to the present disclosure.

1 Bulk region
2 Source region
3 Drain region
4 Tunnel oxide layer
5 Floating gate
6 Dielectric oxide layer
7 Control gate
S1~S4 Operations

DETAILED DESCRIPTION OF THE PREFERRED EMBODIMENTS

The following describes implementations of the present disclosure by using specific embodiments. A person skilled in the art may easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIG. 1 to FIG. 8. It should be noted that the drawings provided in this embodiment only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

As shown in FIG. 1, the present disclosure provides a method for programming a B4 flash memory. The method for programming a B4 flash memory comprises the following operations S1, S2, S3 and S4:

Operation S1). Provide a P-channel flash memory device, and float a source of the P-channel flash memory device.

Figure 2:
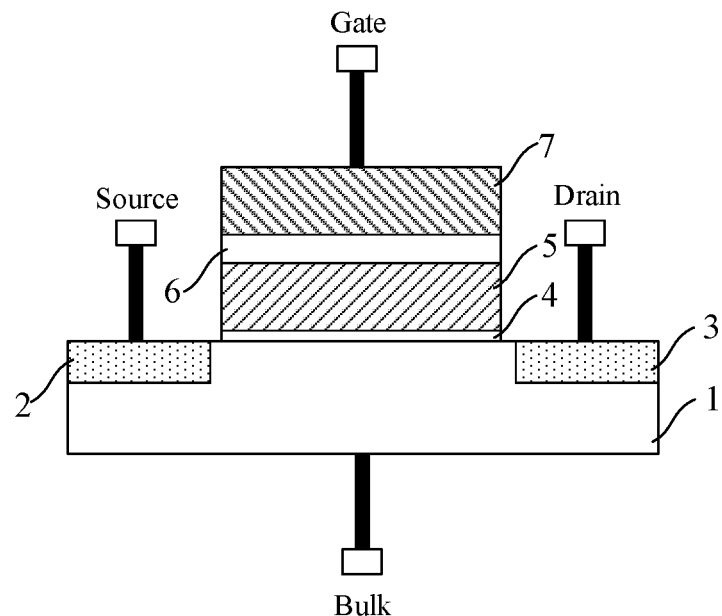
FIG. 2 is a schematic structural diagram of a P-channel flash memory device in accordance to the present disclosure.

Specifically, first, a P-channel flash memory device is provided. For example, as shown in FIG. 2, the P-channel flash memory device comprises a bulk region 1, a source region 2 and a drain region 3 formed in the bulk region 1, and a tunnel oxide layer 4, a floating gate 5, a dielectric oxide layer 6 and a control gate 7 sequentially formed on or above the bulk region 1. The bulk region 1 is an N-type bulk, and the source region 2 and the drain region 3 are P-type doped regions.

Figure 3:
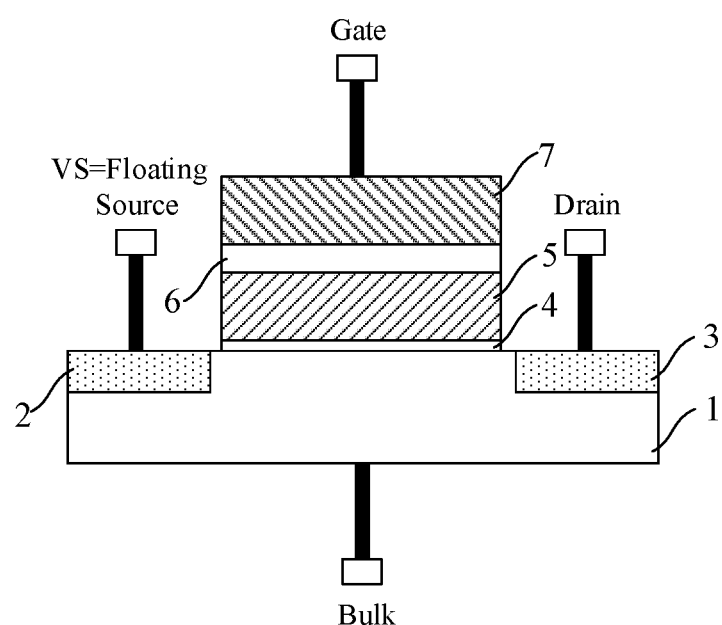
FIG. 3 is a schematic diagram of an operation of floating a source in the method for programming a B4 flash memory v in accordance to the present disclosure.

Specifically, as shown in FIG. 3, a source of the P-channel flash memory device is floated (in this case, a voltage VS on the source is considered as floating), and no voltage is applied to the source during the entire programming. Therefore, no electric field is generated, thereby avoiding a body punch-through effect. Thus, a gate length of the P-channel flash memory device can be reduced to be less than 65 nm, further miniaturing the size of the P-channel flash memory device.

In another implementation of the present disclosure, before operation S1), the method further comprises pre-erasing the P-channel flash memory device to remove a residual charge in the floating gate 5. Manufacturing process, environmental electrostatic factor or the like may accumulate charges in the floating gate 5. Therefore, pre-erase may be performed before operation S1) to eliminate influence of the residual charge on subsequent operations.

Figure 4:
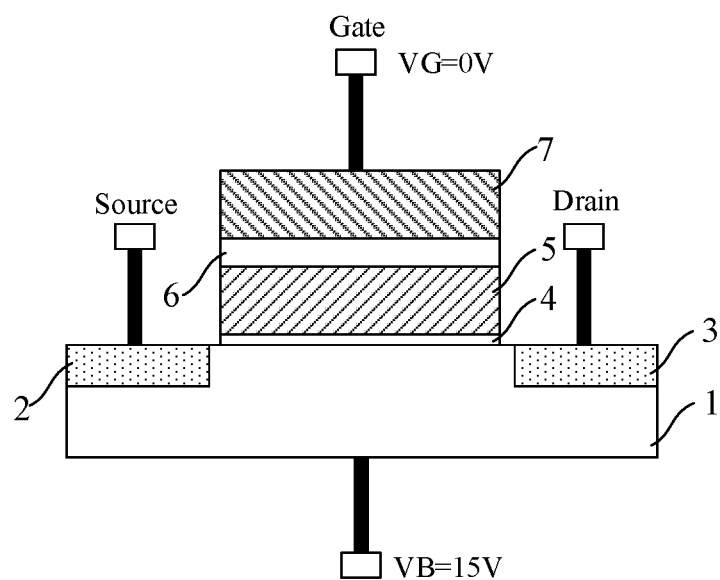
FIG. 4 is a schematic diagram of a pre-erasing operation in the method for programming a B4 flash memory in accordance to the present disclosure.

Specifically, as shown in FIG. 4, voltages are separately applied to the gate and the bulk of the P-channel flash memory device. The voltage VB applied to the bulk is greater than the voltage VG applied to the gate. For example, the difference between the voltage applied to the gate and the voltage applied to the bulk is not less than 10 V. Optionally, the voltage VB applied to the bulk is set to about 15 V, and the voltage VG applied to the gate is set to about 0 V. During actual use, voltage values of VB and VG and the voltage difference between the VB and VG may be set as required (including but not limited to VB=10 V and VG=−5 V; or VB=8V and VG=−1 V), which is not limited to this embodiment, provided that the residual charge in the floating gate 5 can be eliminated so as to avoid influence on the subsequent operations.

It should be noted that, the pre-erasing operation may be omitted, provided that it can be ensured that the residual charge in the floating gate 5 does not affect the subsequent operations, which is not limited to this embodiment. In addition, any method that can realize pre-erasing is applicable to the present disclosure, which is not limited to this embodiment.

Operation S2): Separately apply voltages to a gate, a drain, and a bulk of the P-channel flash memory device to generate electron hole pairs, and injecting holes into the bulk, so that electrons are gathered at the drain to form primary electrons.

Figure 5:
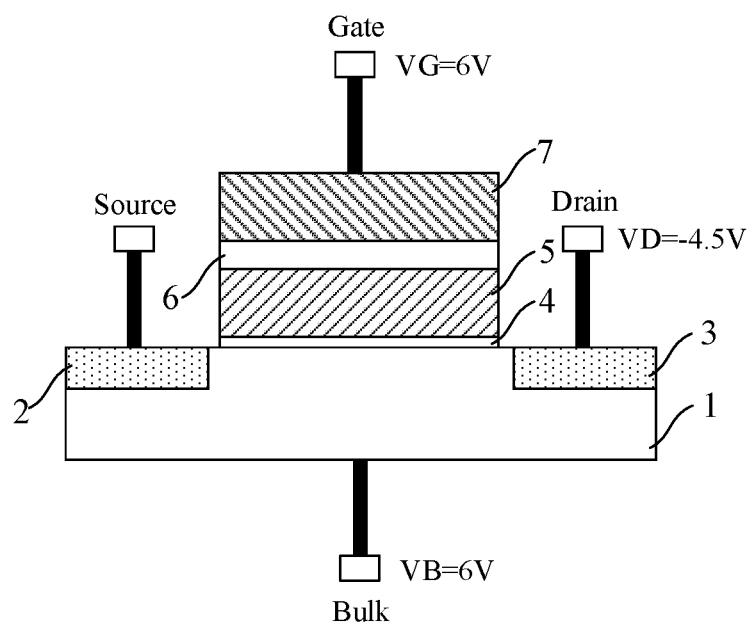
FIG. 5 is a schematic diagram of an operation of forming a primary electron in the method for programming a B4 flash memory in accordance to the present disclosure.

Specifically, as shown in FIG. 5, a voltage VG is applied to the gate of the P-channel flash memory device, a voltage VD is applied to the drain of the P-channel flash memory device, and a voltage VB is applied to the bulk of the P-channel flash memory device. The voltages applied to the gate and the bulk may be substantially the same. The voltage applied to the drain is different from the voltages applied to the gate and the bulk. For example, the voltages applied to the gate and the bulk are greater than the voltage applied to the drain (alternatively, the voltages applied to the gate and the bulk may be less than the voltage applied to the drain).

Under the voltages of the gate and the drain, band-to-band tunneling is formed. The holes are injected into the bulk region 1. Since there is no voltage difference between the gate and the bulk, the electrons cannot obtain sufficient kinetic energy for overcoming a barrier of the tunnel oxide layer 4 so as to be injected into the floating gate 5. Therefore, the electrons are gathered in the drain region 3 (in dynamic equilibrium), forming primary electrons. The difference between the voltages applied to the gate and the bulk and the voltage applied to the drain is merely required to form band-to-band tunneling to generate electron hole pairs. For example, the difference between the voltages applied to the gate and the bulk and the voltage applied to the drain is not less than 10 V (including but not limited to 10.5 V, 12 V, and 15 V). Optionally, the voltage VG applied to the gate and the voltage VB applied to the bulk are set to about 6 V, and the voltage VD applied to the drain is set to about −4.5 V. During actual use, the voltage values of VG, VB, and VD and voltage differences between VG and VB and VD may be set based on actual needs, provided that the electron holes can be obtained, the holes enter the bulk, and the electrons are gathered near the drain, which is not limited to this embodiment.

Operation S3): Separately apply voltages to the drain and the bulk of the P-channel flash memory device, so that an electric field is formed between the drain and the bulk, where within a preset time period, the holes accelerate downward under the action of the electric field and impact the bulk in the P-channel flash memory device to generate secondary electrons.

Figure 6:
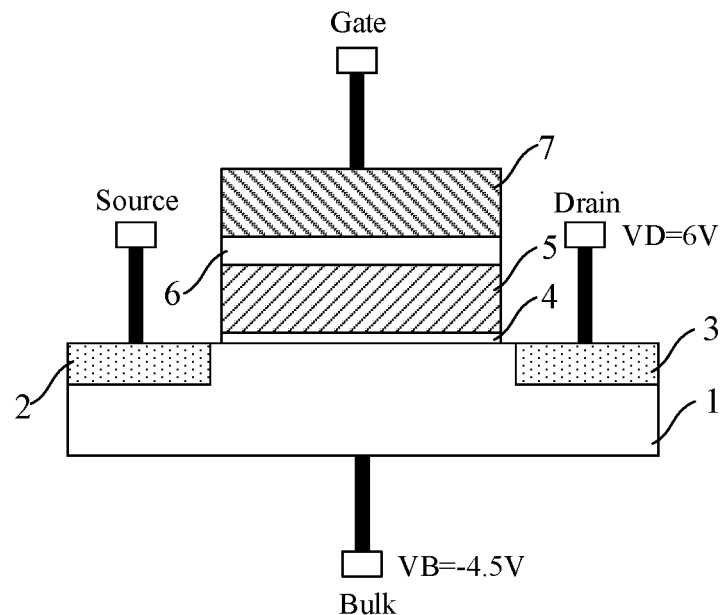
FIG. 6 is a schematic diagram of an operation of forming a secondary electron in the method for programming a B4 flash memory in accordance to the present disclosure.

Specifically, as shown in FIG. 6, after about 10 ns (ranging but not limited from 5 ns to 20 ns) since operation S2), the voltage applied to the gate is removed, and voltages are separately applied to the bulk and the drain. The difference between the voltage applied to the bulk and the voltage applied to the drain is not less than 4 V (including but not limited to 4.3 V, 5 V, 6 V, 7 V, and 8 V). For example, the voltage VB applied to the bulk is set to about −4.5 V, and the voltage VD applied to the drain is set to about 6 V. An electric field is formed between the drain and the bulk, and the holes accelerate downward under the action of the electric field.

It should be noted that, when the voltages applied to the gate and the bulk in operation S2) is less than the voltage applied to the drain, and the electric field formed between the drain and the bulk can enable the holes to accelerate and impact the bulk, in operation S3), the voltage applied to the gate may be removed, the voltages on the drain and the bulk are retained, and the values of the voltages on the drain and the bulk are not changed, thereby simplifying an operation.

Specifically, for example, the preset time period is set to about 10 ns to 100 ns. During actual use, the preset time period may be adjusted based on factors such as a strength of the electric field, provided that the secondary electrons required by the present disclosure can be generated, which is limited to this embodiment.

Specifically, within the preset time period, holes significantly accelerating impact the bulk and generate lighter electrons, that is, secondary electrons.

Operation S4): Separately apply voltages to the gate and the bulk of the P-channel flash memory device, so that the secondary electrons form tertiary electrons under the action of the electric field in a vertical direction, wherein the tertiary electrons are superposed with the primary electrons formed in operation S2) to be injected into a floating gate of the P-channel flash memory device, to complete the programming.

Figure 7:
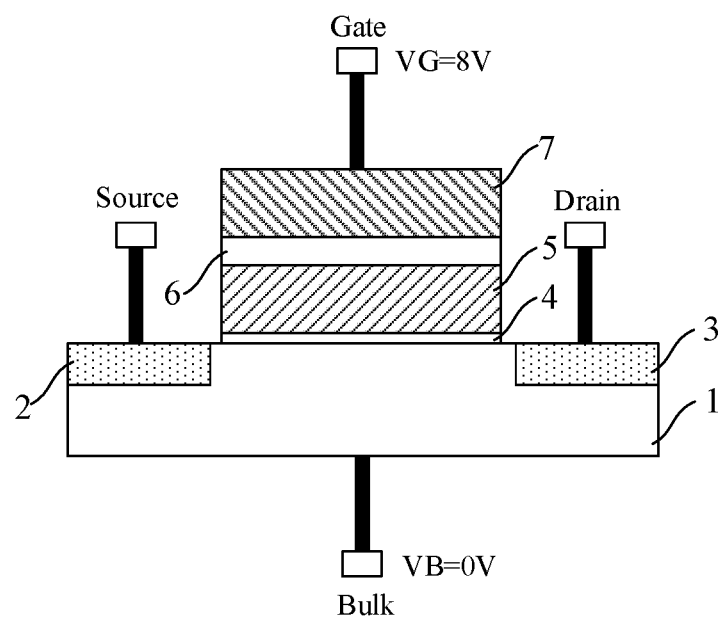
FIG. 7 is a schematic diagram of an operation of forming a tertiary electron and superposing and injecting the tertiary electron and the primary electron into a floating gate in the method for programming a B4 flash memory in accordance to the present disclosure.

Specifically, as shown in FIG. 7, a voltage VG is applied to the gate of the P-channel flash memory device, and a voltage VB is applied to the bulk of the P-channel flash memory device. There is a voltage difference between the gate and the bulk of the P-channel flash memory device and an electric field in the vertical direction is formed therebetween. For example, the difference between the voltage applied to the gate and the voltage applied to the bulk is not less than 7 V. Optionally, the voltage VB applied to the bulk is set to 0 V, and the voltage VG applied to the gate is set to 8 V. During actual use, the voltage values of VB and VG and the voltage difference between VB and VG (including but not limited to VB=0 V and VG=6 V) may be set based on actual needs, provided that it is ensured that the electrons can obtain sufficient kinetic energy to overcome a Si-Oxide barrier and enter the floating gate 5 through the tunnel oxide layer 4, which is not limited to this embodiment.

Specifically, the secondary electrons form tertiary electrons under the action of the electric field in a vertical direction. In addition, the primary electrons formed in operation S2) are superposed on the tertiary electrons under the action of the electric field in the vertical direction, which are injected together into the floating gate 5 of the P-channel flash memory device. In this way, electron excitation and band-to-band tunneling jointly act on the programming, greatly improving programming efficiency.

Figure 8:
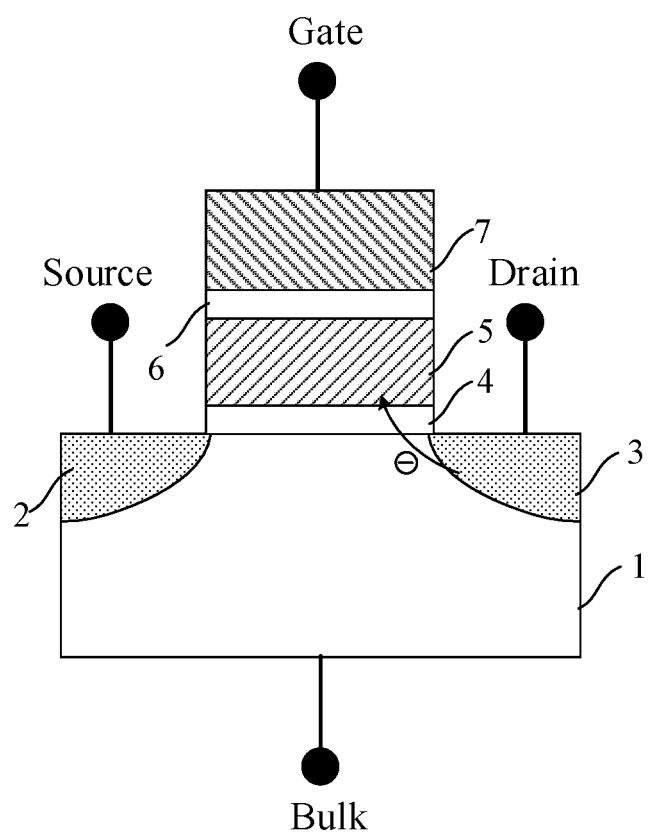
FIG. 8 is a schematic principle diagram of an existing method for programming a B4 flash memory.

As shown in FIG. 8, in a method for programming a B4 flash, voltages are simultaneously applied to a gate, a drain, a source, and a bulk to form electron tunneling. A voltage difference between the gate and the bulk helps electrons obtain kinetic energy to overcome a barrier of a tunnel oxide layer. The electrons are injected into the floating gate through the drain to complete the programming. Th method for programming a B4 flash has only a band-to-band tunneling process, which therefore has lower programming efficiency and higher power consumption of the flash memory device compared with the present disclosure.

The method for programming a B4 flash memory in accordance to the present disclosure forms a horizontal electric field and a longitudinal electric field based on a principle of tertiary electron impact. By means of an improved and optimized programming voltage operation mode, a combination of tertiary electron excitation and band-to-band tunneling is formed for programming, which can significantly improve programming efficiency and reduce power consumption. In addition, the source is always in a floating status during the programming, so that a body punch-through effect can be avoided, creating a condition for further miniaturization of a flash memory.

In conclusion, the present disclosure provides a method for programming a B4 flash memory. The method comprises: providing a P-channel flash memory device, and floating a source of the P-channel flash memory device;

separately applying voltages to a gate, a drain, and a bulk of the P-channel flash memory device to generate electron hole pairs, and injecting holes into the bulk, so that electrons are gathered at the drain to form primary electrons; separately applying voltages to the drain and the bulk of the P-channel flash memory device, so that an electric field is formed between the drain and the bulk, where within a preset time period, the holes accelerate downward under the action of the electric field and impact the bulk in the P-channel flash memory device to generate secondary electrons; and separately applying voltages to the gate and the bulk of the P-channel flash memory device, so that the secondary electrons form tertiary electrons under the action of the electric field in a vertical direction, where the voltage applied to the bulk is less than the voltage applied to the gate, so that the secondary electrons form tertiary electrons under the action of the electric field in a vertical direction, where the tertiary electrons are superposed with the primary electrons to be injected into a floating gate of the P-channel flash memory device, to complete the programming.

In the method for programming a B4 flash memory in accordance to the present disclosure, by means of an improved and optimized programming voltage operation mode, a combination of tertiary electron excitation and band-to-band tunneling is formed for programming, which can effectively improve programming efficiency. In addition, a body punch-through effect can be avoided, creating a condition for further miniaturization of a flash memory. Therefore, the present disclosure effectively overcomes various defects in the prior art, and has a high value in industrial use.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method for programming a B4 flash memory, the method comprising:
    S1) providing a P-channel flash memory device, and floating a source of the P-channel flash memory device;
    S2) separately applying voltages to a gate, a drain, and a bulk of the P-channel flash memory device to generate electron hole pairs, and injecting holes into the bulk, so that electrons are gathered in the drain to form primary electrons, wherein the voltages applied to the gate and the bulk are substantially the same;
    S3) separately applying voltages to the drain and the bulk of the P-channel flash memory device, so that an electric field is formed between the drain and the bulk, wherein within a preset time period, the holes accelerate downward under the action of the electric field and impact the bulk in the P-channel flash memory device to generate secondary electrons; and
    S4) separately applying voltages to the gate and the bulk of the P-channel flash memory device, so that the secondary electrons form tertiary electrons under the action of the electric field in a vertical direction, wherein the tertiary electrons are superposed with the primary electrons formed in operation S2) to be injected into a floating gate of the P-channel flash memory device, to complete the programming.

2. The method for programming a B4 flash memory as in claim 1, wherein
    in operation S2), a difference between the voltages applied to the gate and the bulk and the voltage applied to the drain is not less than 10 V.

3. The method for programming a B4 flash memory as in claim 1, wherein
    in operation S3), the voltage applied to the bulk is less than the voltage applied to the drain.

4. The method for programming a B4 flash memory as in claim 3, wherein
    in operation S3), a difference between the voltage applied to the bulk and the voltage applied to the drain is not less than 4 V.

5. The method for programming a B4 flash memory as in claim 1, wherein the preset time period is set to 10 ns to 100 ns.

6. The method for programming a B4 flash memory as in claim 1, wherein
    in operation S4), the voltage applied to the bulk of the P-channel flash memory device is less than the voltage applied to the gate.

7. The method for programming a B4 flash memory as in any claim 1, wherein
    before operation S1), the method further comprises pre-erasing the P-channel flash memory device to remove a residual charge in the floating gate.

8. The method for programming a B4 flash memory as in claim 7, wherein
    the voltages are separately applied to the gate and the bulk of the P-channel flash memory device, and the voltage applied to the bulk is greater than the voltage applied to the gate.

9. The method for programming a B4 flash memory as in claim 8, wherein
    a difference between the voltage applied to the gate and the voltage applied to the bulk is not less than 10 V.

* * * * *